United States Patent
Bacquet et al.

(10) Patent No.: US 9,945,925 B2
(45) Date of Patent: Apr. 17, 2018

(54) METHOD FOR DETECTING A MALFUNCTION OF A BATTERY CONTROL SYSTEM

(71) Applicant: Commissariat à l'Énergie Atomique et aux Énergies Alternatives, Paris (FR)

(72) Inventors: Sylvain Bacquet, Chasselay (FR); Warody Lombardi, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 7 days.

(21) Appl. No.: 15/037,293

(22) PCT Filed: Nov. 19, 2014

(86) PCT No.: PCT/FR2014/052968
§ 371 (c)(1),
(2) Date: May 17, 2016

(87) PCT Pub. No.: WO2015/075382
PCT Pub. Date: May 28, 2015

(65) Prior Publication Data
US 2016/0291114 A1 Oct. 6, 2016

(30) Foreign Application Priority Data

Nov. 21, 2013 (FR) ...................................... 13 61474

(51) Int. Cl.
*G01N 27/416* (2006.01)
*G01R 35/00* (2006.01)
(Continued)

(52) U.S. Cl.
CPC ......... *G01R 35/00* (2013.01); *G01R 31/2829* (2013.01); *G01R 31/3644* (2013.01); *G01R 31/3658* (2013.01)

(58) Field of Classification Search
None
See application file for complete search history.

(56) References Cited

U.S. PATENT DOCUMENTS 7,461,360 B1 * 12/2008 Ho ...................... G06F 17/5081
716/109
2005/0225290 A1 10/2005 Hasimoto et al.
(Continued)

FOREIGN PATENT DOCUMENTS

DE 102011005603 A1 9/2012
DE 102011080512 A1 2/2013
(Continued)

OTHER PUBLICATIONS

International Preliminary Report on Patentability, dated Jan. 21, 2015, from corresponding International Application No. PCT/FR2014/052968.
(Continued)

*Primary Examiner* — Patrick Assouad
*Assistant Examiner* — Demetrius Pretlow
(74) *Attorney, Agent, or Firm* — Wolf, Greenfield & Sacks, P.C.

(57) ABSTRACT

A method for detecting a malfunction of a battery control system including a plurality of sensors intended to measure separate physical quantities of the battery, the method including the following steps: a) reading output values of the sensors; and b) determining, by means of a processing unit, whether the read values are consistent with a physical phenomenon conditioning relationships between at least two of the quantities.

7 Claims, 1 Drawing Sheet

(51) Int. Cl.
*G01R 31/36* (2006.01)
*G01R 31/28* (2006.01)

(56) References Cited

U.S. PATENT DOCUMENTS

| | | |
|---|---|---|
| 2005/0242776 A1 | 11/2005 | Emori |
| 2007/0120537 A1* | 5/2007 | Yamamoto ......... G01R 31/3679 320/150 |
| 2009/0078400 A1* | 3/2009 | Tamura .............. B60H 1/00278 165/287 |
| 2009/0309545 A1 | 12/2009 | Kunimitsu |
| 2011/0254502 A1 | 10/2011 | Yount et al. |
| 2011/0288723 A1 | 11/2011 | Weiss et al. |
| 2012/0025769 A1 | 2/2012 | Kikuchi |
| 2013/0135110 A1* | 5/2013 | Xie ...................... G08B 29/181 340/636.11 |
| 2013/0162052 A1 | 6/2013 | Gaul et al. |
| 2014/0255738 A1* | 9/2014 | Adams ................. H01M 10/48 429/90 |
| 2016/0084918 A1* | 3/2016 | Hongo ................. G01R 31/362 702/63 |

FOREIGN PATENT DOCUMENTS

| | | |
|---|---|---|
| DE | 102011083277 A1 | 3/2013 |
| DE | 102012201528 A1 | 8/2013 |
| EP | 1391962 A1 | 2/2004 |
| EP | 2210529 A1 | 3/2009 |
| EP | 2043222 A2 | 4/2009 |
| EP | 2421113 A2 | 2/2012 |

OTHER PUBLICATIONS

International Search Report, dated Jan. 21, 2015, from corresponding International Application No. PCT/FR2014/052968.

* cited by examiner

METHOD FOR DETECTING A MALFUNCTION OF A BATTERY CONTROL SYSTEM

CROSS-REFERENCE TO RELATED APPLICATIONS

This application is the national phase of International Application No. PCT/FR2014/052968, filed on Nov. 19, 2014, which claims the priority benefit of French patent application FR13/61474, filed on Nov. 21, 2013, both of which applications are hereby incorporated by reference to the maximum extent allowable by law.

BACKGROUND

The present application relates to the field of electric battery management systems, generally designated with acronym BMS in the art. It particularly aims at a method of detecting a malfunction of a battery management system.

DISCUSSION OF THE RELATED ART

An electric battery is a group of a plurality of rechargeable elementary cells (batteries, accumulators, etc.) connected in series and/or in parallel between two voltage supply nodes or terminals. An electric battery is generally coupled to a battery management system or BMS, that is, an electronic circuit capable of implementing various functions such as battery protection functions during charge or discharge phases, particularly by preventing the battery cells from operating outside of nominal ranges of temperature, voltage, current, etc., battery cell balancing functions, functions of monitoring the state of charge and/or the state of aging of the battery, etc. Battery control systems may comprise a relatively large number of sensors, arranged to measure voltages, currents, temperatures, etc. at various points of the battery. The sensors may be connected to a processing and control unit capable of reading the sensor output values, of processing and interpreting these values and, according to the read values, of ordering, if necessary, control measures such as interrupting or decreasing a battery charge or discharge current.

There is a need for a solution enabling to detect a possible malfunction of a battery management system and, more particularly, of one or a plurality of sensors of a battery management system.

Indeed, conventionally, when a sensor of a battery management system outputs an abnormal value, it is assumed, as a precaution, that the battery is failing, and protection operations or measures for placing the battery in safe conditions are ordered by the management system. Protection measures are generally constraining for the user, and may in particular comprise disconnecting the battery. In particular, in certain sensitive fields such as the field of high-power electric vehicle batteries, when an abnormal value is detected, the battery is immediately disconnected to take no risk, which causes an immobilization of the vehicle. The pack comprising the battery and its management system is then examined by a technical specialist, in a relatively long and expensive process, to identify the origin of the defect.

However, in certain cases, when a sensor of a battery management system outputs an abnormal value, the failure may be at the level of the sensor itself, and not of the battery. It would be desirable to be able to distinguish between a failure of the battery management system and an effective battery failure, to be able to avoid a constraining procedure for placing the battery in safe conditions if such a procedure is not necessary. As an example, in case of a failure of a sensor of the management system, it could be sufficient to notify the failure to the user, to allow him/her to have the management system repaired at his/her convenience, without for all this interrupting the battery operation.

To enable to distinguish between a failure of the battery management system and an effective battery failure, it has already been provided to duplicate certain sensors of the control system, that is, to provide two identical sensors arranged to measure a same physical quantity, for example, the voltage between two nodes of the battery, or the temperature of a specific area of the battery. In case of an inconsistency between the measurements output by the two sensors, it can be deduced that one of the sensors is defective. The provision of redundant sensors however increases the cost and the bulk of the management system.

It would be desirable to have a reliable, inexpensive, and low-bulk solution enabling to detect a malfunction of an electric battery management system.

SUMMARY

Thus, an embodiment provides a method of detecting a malfunction of a battery management system comprising a plurality of sensors intended to measure different physical quantities of the battery, the method comprising the steps of: a) reading output values of the sensors; and b) determining, by means of a processing unit, whether the read values are consistent with a physical phenomenon conditioning relations between at least two of the quantities.

According to an embodiment, the sensors are intended to measure voltages and/or currents between battery nodes and, at step b), it is determined whether at least one equation, resulting from the law of conservation of electric energy, or Kirchhoff's law, in the management system, is satisfied by the read values.

According to an embodiment, the equation comprises a mesh equation or a node equation of the management system.

According to an embodiment, at step b), it is determined, for each sensor, whether all the mesh equations of a set of meshes of the system which comprise the sensor are satisfied by the read values.

According to an embodiment, at step b), it is determined, for each sensor, whether the equations of all the meshes of the system which comprise the sensor are satisfied by the read values.

According to an embodiment, when a malfunction of a sensor is detected, the processing unit determines the value of the physical quantity that the sensor was intended to measure, based on output values of other sensors of the system.

According to an embodiment, the step of determining the value of the physical quantity that the defective sensor was intended to measure comprises the solving, by the processing unit, of at least one mesh or node equation including the defective sensor.

According to an embodiment, the sensors are intended to measure temperatures of different battery areas and, at step b), it is determined whether the read values are consistent with the thermal diffusion phenomena inside of and around the battery.

According to an embodiment of the present invention, the method comprises: a first step of reading the output values of the sensors at a first time; a step of determining by calculation, by means of the processing unit, based on the values read during the first reading step, the temperature expected at the level of at least one first sensor of the system after a diffusion period; and a second step of reading the output value of the first sensor, posterior to the first reading step by a time period equal to the diffusion period.

According to an embodiment of the present invention, the method further comprises a step of comparing, by means of the processing unit, the output value read during the second reading step and the expected value determined by calculation.

According to an embodiment, the method further comprises a step of detecting a possible variation of the output value of the first sensor.

According to an embodiment, the diffusion period is in the range from 10 seconds to 5 minutes.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

According to an aspect of the described embodiments, a method of detecting a malfunction of a battery management system comprising a plurality of sensors intended to measure different physical quantities of the battery is provided. The method comprises reading the output values of the sensors. It further comprises a step of verifying, by means of a device or of a processing unit, whether the read values are consistent with a physical phenomenon conditioning relations between at least two of the measured physical quantities.

According to a first embodiment, which will be described in further detail in relation with FIG. 1, the sensors are current and/or voltage sensors and the physical phenomenon underlying the verification of the consistency of the values output by the sensors is the law of conservation of energy in an electric system, expressed by Kirchhoff's laws.

According to a second embodiment which will be described in further detail in relation with FIG. 2, the sensors are temperature sensors, and the physical phenomenon underlying the verification of the consistency of the values output by the sensors is thermal diffusion, which can be analytically expressed by diffusion equations.

These two embodiments may be combined in the case of a battery management system comprising both voltage and/or current sensors and temperature sensors.

Figure 1:
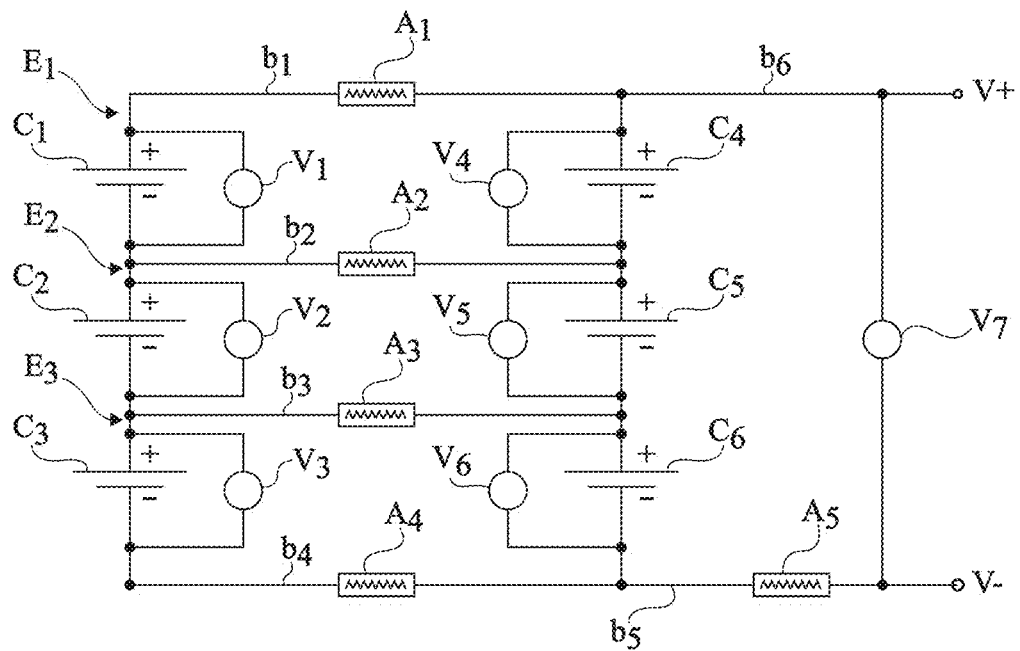
FIG. 1 schematically shows an example of an assembly comprising a battery and a battery management system.

FIG. 1 schematically shows an example of an assembly comprising a battery of six elementary cells $C_i$, $i$ being an integer in the range from 1 to 6, and a management system of this battery. In this example, cells $C_i$ are gathered in three stages E1, E2, and E3, each comprising two cells in parallel, stages E1, E2, and E3 being series-connected between two terminals V+ and V−, respectively positive and negative, for providing the battery voltage. It will be within the abilities of those skilled in the art to adapt the described embodiments to batteries comprising a number of cells different from six, a number of stages different from three, and/or a number of cells per stage different from two.

In the shown example, stage E1 comprises cells C1 and C4, stage E2 comprises cells C2 and C5, and stage E3 comprises cells C3 and C6. In this example, a conductor b1, for example, a conductive track or a conductive wire, connects the positive terminal of cell C1 to the positive terminal of cell C4, a conductor b2 connects the midpoint between the negative terminal of cell C1 and the positive terminal of cell C2 to the midpoint between the negative terminal of cell C4 and the positive terminal of cell C5, a conductor b3 connects the midpoint between the negative terminal of cell C2 and the positive terminal of cell C3 to the midpoint between the negative terminal of cell C5 and the positive terminal of cell C6, a conductor b4 connects the negative terminal of cell C3 to the negative terminal of cell C6. Further, in this example, a conductor b5 connects conductor b4 to negative terminal V− of the battery, and a conductor b6 connects conductor b1 to positive terminal V+ of the battery.

In this example, the battery management system comprises six voltage sensors V1 to V6, respectively arranged to measure the voltage across cells C1 to C6, a seventh voltage sensor V7, arranged to measure the voltage between terminals V+ and V− of the battery, and five current sensors A1 to A5, respectively arranged to measure the current flowing through conductors b1 to b5. The battery management system of FIG. 1 further comprises a processing and control unit 101 (PU) capable of reading the sensor output values and, according to the read values, of ordering various battery management measures or operations.

To detect a malfunction of the battery management system of FIG. 1, it is provided, in this example, to read the output values of sensors V1 to V7 and A1 to A5, and then to verify, by means of processing unit 101, whether the read output values are consistent with Kirchhoff's laws of conservation of energy in an electric system, and more particularly with the mesh rule and/or with the nodal rule. More particularly, it is provided to verify, by means of processing unit 101, that one or a plurality of equations resulting from the mesh rule and/or from the nodal rule for the considered system are satisfied by the sensor output values.

In the example of FIG. 1, each of current sensors A1 to A5 comprises a lightly resistive element, for example, having a resistance lower than 5 milliohms, inserted on the flow path of the current which is desired to be measured, and a device for measuring the voltage across the lightly-resistive element. The output values of sensors A1 to A5 are thus actually voltage values representative of the currents flowing through conductors b1 to b5. In this example, the detection of a malfunction of the battery management system can thus be only based on the compliance, by the output values of sensors V1 to V7 and A1 to A5, with one or a plurality of equations resulting from the mesh rule for the considered system. The described embodiments are however not limited to this specific case.

As an example, considering, in the assembly of FIG. 1, the mesh formed by cell C2, conductor b2, cell C5, and conductor b3, and designating the output voltage values of sensors V1 to V7 and A1 to A5 with the same references as the actual sensors, equation V2−A2−V5+A3=0 results from the mesh rule for this portion of the management system, and should be satisfied by the sensor output values. If this equation is not complied with by the sensor output values, it can be deduced that at least one of sensors V2, A2, V5, and A3 is defective. It should be noted that in the meaning of the present application, a mesh equation is considered to be satisfied if the absolute value of the sum of the output values of the sensors in the mesh is smaller than or equal to a threshold, which may be slightly greater than zero to take into account measurement inaccuracies of the sensors.

According to an aspect of the first embodiment, for a given battery management system, a set of one or a plurality of meshes such that each of the sensors which is desired to be tested is comprised within at least one mesh of the assembly may be identified. To detect a possible malfunction of the control system, it may then be provided to read the output values of the sensors, and then to verify, by means of processing unit 101, whether the read values satisfy the different identified mesh equations. If at least one mesh equation is not complied with by the sensor output values, it can be deduced that at least one sensor of the system is defective.

As an example, to detect a possible malfunction of the battery management system of FIG. 1, it may be provided to verify that the sensor output values satisfy mesh equations $V3+V2+V1-A1-V4-V5-V6+A4=0$ and $V2-A2+V4-V7+A5+V6+A3=0$. If one of the two equations if not verified, it can be deduced that at least one sensor of the management system of FIG. 1 is defective. It will be within the abilities of those skilled in the art to identify other mesh assemblies comprising all the sensors to be tested and to use the corresponding mesh equations to detect a possible failure of the battery management system.

In certain applications, it may further be desired to locate the defective sensor(s) of the battery management system, for example, to ease their replacing, or to be able to reconfigure the management system in a fail soft operating mode which does not use the output values of the defective sensors.

To achieve this, it may be provided, for each sensor in the system, to identify all the meshes in the system which comprise the sensor. To detect and locate a possible malfunction of the control system, it may then be provided to read the output values of the sensors, and then to verify, by means of processing unit 101, whether the read values satisfy the different identified mesh equations. If at least one mesh equation is not complied with by the sensor output values, it can be deduced that at least one sensor in the system is defective. If, for a given sensor, none of the equations of the meshes which comprise the sensor is satisfied, it can be deduced that the sensor is defective or most likely defective.

As an example, in the assembly of FIG. 1, considering sensor A3, the set of mesh equations of the assembly comprising sensor A3 is the following:

$V2-A2-V5+A3=0$, $V3+A4-V6-A3=0$, $V2+V1-A1-V4-V5+A3=0$, $V2+V1-A1-V7+A5+V6+A3=0$, $V2-A2+V4-V7+A5+V6+A3=0$, $V5+A2+V1-A1-V7+A5+A4+V3-A3=0$, and $V5+V4-V7+A5+A4-V3-A3=0$.

If none of the equations in the set is verified by the output values of the sensors, it can be deduced that sensor A3 is defective or most likely defective.

It should be noted that when a defective sensor is identified, the missing measurement can be determined by calculation based on the output values of other sensors in the system, by using one or a plurality of the above-mentioned Kirchhoff equations. To achieve this, a mesh comprising the defective sensor and having all its other sensors assumed to be sound may for example be considered. It is then provided, by means of processing unit 101, to solve the equation of this mesh, the only unknown thereof being the voltage across the defective sensor. Thereby, the processing unit may keep on monitoring the variation of the physical quantity that the defective sensor was intended to measure.

As an example, the above-described malfunction detection method according to the first embodiment may be implemented periodically by control and processing unit 101, for example, with a periodicity in the range from 10 seconds to two minutes.

An advantage of this method is that it enables, in a simple and inexpensive way, to detect a failure of the battery management system, and particularly to tell such a failure from a failure of the battery itself. Constraining battery protection operations can thus be avoided when not absolutely necessary.

Various alterations, modifications, and improvements of the first embodiment will readily occur to those skilled in the art.

In particular, it will be within the abilities of those skilled in the art to adapt the above-described system to other battery management system architectures than that of the example of FIG. 1.

Further, it will be within the abilities of those skilled in the art to implement a method of the above-described type by using, to verify the consistency of the output values of the system sensors, not only mesh equations, but also node equations of the system (sum of the currents flowing into the node equal to the sum of the currents coming out of the node), or only node equations.

Further, in the case of a control system comprising a large number of voltage and/or current sensors, it may be provided not to systematically verify all the mesh and/or node equations of the system, but only part of these equations, including to locate defective sensors. As an example, it may be provided, for each sensor in the system, to identify a number of N meshes of the system comprising the sensor, where N is an integer smaller than the total number of meshes of the system comprising the sensor. To detect and locate a malfunction of the control system, it may then be provided to read the output values of the sensors, and then to verify, by means of processing unit 101, whether the read values satisfy the different identified mesh equations. If, for a given sensor, none of the N equations of identified meshes comprising the sensor is satisfied, it can be deduced that the sensor has a high probability of being defective. This enables to decrease the complexity of the calculation of the failure locating method, while providing statistically reliable defect locating performances.

Figure 2:
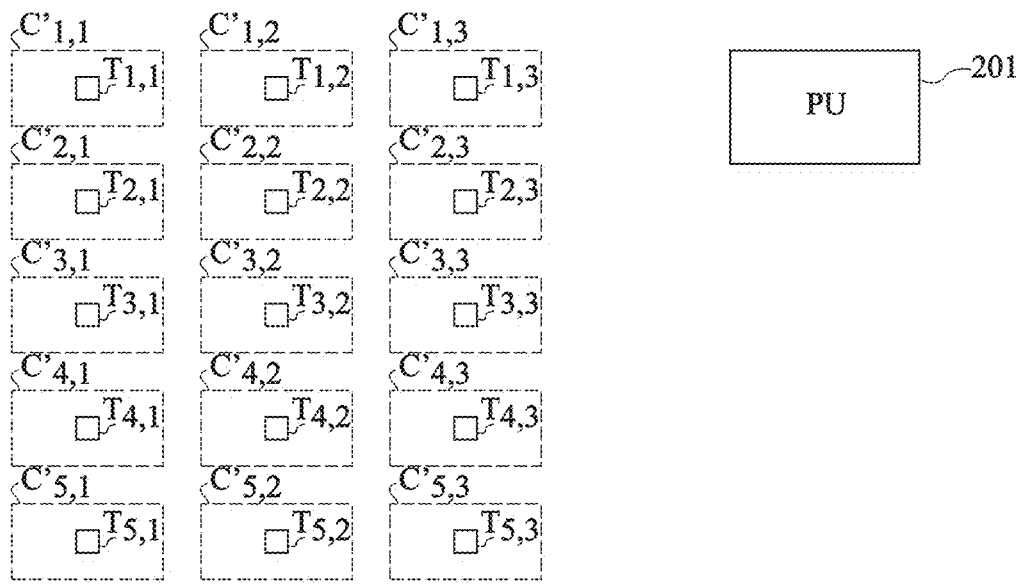
FIG. 2 schematically shows another example of an assembly comprising a battery and a battery management system.

FIG. 2 schematically shows an example of an assembly comprising a battery of fifteen elementary cells, and a management system of this battery.

In this example, the battery cells are arranged in an array of five rows and three columns. In FIG. 2, the cells are shown by rectangles in dotted lines, and are designated with references $C'_{j,k}$, where j is an integer from 1 to 5 designating the rank of the row of the array containing the cell, and k is an integer from 1 to 3 designating the rank of the column of the array containing the cell. The interconnection diagram of cells $C'_{j,k}$ of the battery has not been shown in FIG. 2, the second embodiment being compatible with any diagram of interconnection of elementary cells in a battery. It should further be noted that the second embodiment is compatible with batteries having a number of cells different from fifteen, and/or a cell layout different from that of FIG. 2.

In this example, the battery control system comprises fifteen temperature sensors Tj,k, respectively arranged to measure the temperature in the vicinity of cells C'j,k. Thus, sensors Tj,k are arranged to measure the temperature of fifteen different points of the battery. The battery management system of FIG. 2 further comprises a processing and control unit 201 (PU) capable of reading the output values of sensors Tj,k and, according to the read values, of ordering various battery management measures or operations.

To detect a malfunction of the battery control system of FIG. 2, it is provided, in this example, to read the output values of sensors Tj,k and, in case of a significant variation (increase or decrease) of the output value of one of the sensors, which will be called primary sensor, to verify that after a certain period selected according to the heat diffusion speed in the battery, for example, a period in the range from 10 seconds to 5 minutes, one or a plurality of other sensors Tj,k, which will be called secondary sensors, preferably close to the primary sensor, also measure a temperature variation consistent with the temperature variation of the primary sensor. If one of the secondary sensors measures no temperature variation consistent with the temperature variation of the primary sensor, it can be deduced that one of the primary or secondary sensors is most likely defective. If none of the secondary sensors measures no temperature variation consistent with the temperature variation of the primary sensor, it can be deduced that the primary sensor is most likely defective. If only a minority of secondary sensors, for example, a single secondary sensor, measures no temperature variation representative of the temperature variation of the primary sensor, it can be deduced that this minority of secondary sensors is most likely defective.

As an example, to detect a failure of the battery management system of FIG. 2, the following operation may be implemented.

First, the output values of sensors Tj,k are regularly read, for example, at the rate required by the battery management system to carry out usual battery management operations.

During the successive readings, it is provided to detect, by means of processing unit 201, a possible remarkable thermal event such as a non-negligible variation (increase or decrease) of the output value of one of the sensors.

When such a thermal even occurs, the next malfunction detection method may be implemented by processing unit 201.

In a first phase, processing unit 201 determines by calculation the expected value, at the end of a diffusion period, of the temperature at the level of sensors in the vicinity (secondary sensors) of the sensor having measured the remarkable thermal event (primary sensor). To achieve this, processing unit 201 is for example based on initial conditions corresponding to the output values of all the sensors of the system at the time of the remarkable event, and simulates by calculation the temperature variation in the system based on these initial conditions, by using thermal diffusion equations. As a non-limiting example, to simplify the calculations performed by processing unit 201, constant edge conditions may be considered, that is, it may be considered that the temperature at the edges of the assembly does not vary.

At the end of the diffusion period considered for the simulation, the sensor output values are read again.

Processing unit 201 then compares, for each of the secondary sensors, the simulated temperature value determined by calculation by the processing unit, with the real output value of the sensor at the end of the diffusion period considered for the simulation.

It the difference between the simulated value and the real value exceeds a threshold, it can be considered that there is an inconsistency between the output values of sensors Tj,k and the thermal diffusion phenomena which rule the relations between the temperatures measured by the sensors. A malfunction of the battery management system can be deduced. Taking into account the detected number of inconsistencies and of sensors concerned by the inconsistencies, processing unit 201 may locate the defective sensor(s). When a defective sensor is located, it is further possible, by solving diffusion equations, to estimate the real temperature in the vicinity of the defective sensor, based on the output values provided by valid neighboring sensors.

The equation which rules the thermal diffusion phenomenon interconnecting the quantities measured by temperature sensors Tj,k is the equation of temperature diffusion in space and time, which may for example be expressed as an approximation in the form of finite differences by the following formula:

$$\frac{T(x, y, t+1) - T(x, y, t)}{\Delta t} = \\ r_x \left( \frac{T(x+1, y, t) - 2T(x, y, t) + T(x-1, y, t)}{\Delta x^2} \right) + \\ r_y \left( \frac{T(x, y+1, t) - 2T(x, y, t) + T(x, y-1, t)}{\Delta y^2} \right) + \\ (1 - 2r_x - 2r_y) T(x, y, t)$$

where x and y designate the coordinates of points of a discretized two-dimensional spatial domain, t designates a time of a discretized time domain, $\Delta x$, $\Delta y$, and $\Delta t$ respectively designate the discretization step in x, y, and t of the considered spatial and time domains, and T(x,y,t) designates the temperature, at time t, of the point of coordinates (x, y) in the considered spatial and time domains, and where quantities rx and ry are expressed as follows:

$$r_x = \alpha \frac{\Delta t}{\Delta x^2}; \text{ and } r_y = \alpha \frac{\Delta t}{\Delta y^2},$$

where a designates a term relative to the thermal physical constants of the system.

In the case where the cells are separated from one another by air, term a can be expressed by formula $\alpha=(K^*Cp)/r0$, where K is the thermal conductivity of air, r0 designates the mass volume of air, and Cp designates the thermal constant of air. As an example, with K=0.025 W·m-1·K-1, r0=1.2 kg·m-3, and Cp=1,000 J·kg-1.K-1, a value $\alpha$ in the order of 2.083*10-5 is obtained.

For a battery occupying an approximately rectangular space of 22 cm in direction x and 11 cm in direction y, if the number of discretization points of the space occupied by the battery is 100 along coordinate x and 50 along coordinate y, and if the time discretization step $\Delta t$ is 0.01 s, values rx=0.0422 and ry=0.0413 are obtained.

Based on the above-mentioned discretized thermal diffusion equation, processing unit 201 may determine by finite element simulation the expected variation, at the end of a diffusion period, of the temperature at the level of so-called secondary sensors, after a remarkable thermal event at the level of a so-called primary sensor. This same equation may be used by processing unit 201 in case of a failure of a sensor, to estimate the temperature at the level of this sensor based on output values of neighboring sensors.

The described embodiments are however not limited to the use of this specific diffusion equation to verify the consistency of the sensor output values with the physical thermal diffusion laws in the battery, or to estimate a missing temperature value at the level of a possible defective sensor.

An advantage of the second embodiment is that it enables, in a simple and inexpensive way, to detect a failure of the battery management system, and particularly to tell such a failure of a temperature sensor of the management system from a failure of the battery itself. Constraining battery protection operations can thus be avoided when not essential.

Various alterations, modifications, and improvements of the second embodiment will readily occur to those skilled in the art.

In particular, it will be within the abilities of those skilled in the art to adapt the above-described system to other battery management system architectures than that of the example of FIG. 1, for example, to systems comprising less than one temperature sensor per cell, or more than one temperature sensor per cell.

What is claimed is:

1. A method of detecting a malfunction of a voltage sensor of a battery management system comprising a plurality of voltage sensors defining a set of meshes such that each of the sensors is comprised within several meshes of the set, and such that in each of the meshes, in a normal operating mode, the sum of the output values of the voltage sensors of the mesh is equal to zero to within the margin of accuracy of the sensors, the method comprising the steps of:
    a) reading the output values of said sensors; and
    b) determining, by means of a processing unit, whether the read values satisfy the meshes equations of said set of meshes, a mesh equation being considered to be satisfied if the sum of the output values of the sensors in the mesh is equal to zero to within the margin of accuracy of the sensors;
    wherein, when a malfunction of a sensor is detected, the processing unit determines the voltage value that this sensor was intended to measure, based on output values of other sensors of the system.

2. The method of claim 1, wherein the step of determining the voltage value that the defective sensor was intended to measure comprises the solving, by the processing unit, of at least one mesh equation including the defective sensor.

3. A method of detecting a malfunction of a voltage sensor of a battery management system comprising a plurality of voltage sensors defining a set of meshes such that each of the sensors is comprised within several meshes of the set, and such that in each of the meshes, in a normal operating mode, the sum of the output values of the voltage sensors of the mesh is equal to zero to within the margin of accuracy of the sensors, the method comprising the steps of:
    a) reading the output values of said sensors; and
    b) determining, by means of a processing unit, whether the read values satisfy the meshes equations of said set of meshes, a mesh equation being considered to be satisfied if the sum of the output values of the sensors in the mesh is equal to zero to within the margin of accuracy of the sensors;
    further comprising a plurality of temperature sensors intended to measure temperatures of different battery areas, the method further comprising the following steps:
    c) reading the output values of said temperature sensors; and
    d) determining, by means of the processing unit, whether the read values are consistent with the thermal diffusion phenomena inside of and around the battery.

4. The method of claim 3, comprising:
    a first step of reading the output values of the temperature sensors at a first time;
    a step of determining by calculation, by means of the processing unit, based on the values read during the first reading step, the temperature expected at the level of at least one first temperature sensor of the system after a diffusion period; and
    a second step of reading the output value of said at least one first temperature sensor, posterior to the first reading step by a time period equal to said diffusion period.

5. The method of claim 4, further comprising a step of comparing, by means of the processing unit, the output value read during the second reading step and the expected value determined by calculation.

6. The method of claim 4, further comprising a step of detecting a possible variation of the output value of said at least one first temperature sensor.

7. The method of claim 4, wherein said diffusion period is in the range from 10 seconds to 5 minutes.

* * * * *